United States Patent
Fareed et al.

(10) Patent No.: US 6,841,809 B2
(45) Date of Patent: Jan. 11, 2005

(54) HETEROSTRUCTURE SEMICONDUCTOR DEVICE

(75) Inventors: Qhalid Fareed, Columbia, SC (US); Remigijus Gaska, Columbia, SC (US); Michael Shur, Latham, NY (US)

(73) Assignee: Sensor Electronic Technology, Inc., Latham, NY (US)

( * ) Notice: Subject to any disclaimer, the term of this patent is extended or adjusted under 35 U.S.C. 154(b) by 0 days.

(21) Appl. No.: 10/659,183

(22) Filed: Sep. 10, 2003

(65) Prior Publication Data

US 2004/0201037 A1 Oct. 14, 2004

Related U.S. Application Data

(60) Provisional application No. 60/461,092, filed on Apr. 8, 2003.

(51) Int. Cl.$^7$ ............................................. H01L 31/0328
(52) U.S. Cl. ..................................... 257/192; 257/183
(58) Field of Search ................................... 257/183, 184, 257/185, 186, 187, 188, 189, 190, 191, 192, 193, 194, 195, 196, 197, 198, 199, 200, 201

(56) References Cited

U.S. PATENT DOCUMENTS

| | | | |
|---|---|---|---|
| 5,851,905 A | | 12/1998 | McIntosh et al. |
| 5,981,977 A | | 11/1999 | Furukawa et al. |
| 6,316,793 B1 | * | 11/2001 | Sheppard et al. |
| 6,359,292 B1 | | 3/2002 | Sugawara et al. |
| 2002/0171405 A1 | * | 11/2002 | Watanabe |
| 2004/0061129 A1 | * | 4/2004 | Saxler et al. |

OTHER PUBLICATIONS

"Ferroelectric Semiconductors," V. M. Fridkin, Russia (1976), p. 90 (pp. 64–65 in English version).

"High Pinch–off Voltage AlGaN–GaN Heterostructure Field Effect Transistor," M. S. Shur et al., Proceedings of ISDRS–97, Charlottesville, VA, Dec. 1997, pp. 377–380.

"Optoelectronic GaN–Based Field Effect Transistors," M. S. Shur et al., SPIE vol. 2397, pp. 294–303.

"Current/Voltage Characteristic Collapse in AlGaN/GaN Heterostructure Insulated Gate Field Effect Transistors at High Drain Bias," M. A. Khan et al., Electronic Letters, vol. 30, No. 25, Dec. 8, 1994, pp. 2175–2176.

"High–Power Microwave GaN/AlGaN HEMT's on Semi–Insulating Silicon Carbide Substrates," S. T. Sheppard et al., IEEE Electron Device Letters, vol. 20, No. 4, Apr. 1999, pp. 161–163.

"High Performance Microwave Power GaN/AlGaN MOD-FETs Grown By RF–Assisted MBE," N.X. Nguyen et al., Electronics Letters, vol. 36, No. 5, Mar. 2, 2000, pp. 468–469.

"High Electron Mobility Transistor Based on a GaN–AlxGa1–xN Heterojunction," M. Asif Khan et al., Applied Physics Letters, vol. 63, No. 9, Aug. 30, 1993, pp. 1214–1215.

"AlGaN/GaN Metal Oxide Semiconductor Heterostructure Field Effect Transistor," M. Asif Khan et al., IEEE Electron Device Letters, vol. 21, No. 2, Feb. 2000, pp. 63–65.

(List continued on next page.)

Primary Examiner—Nathan J. Flynn
Assistant Examiner—Kevin Quinto
(74) Attorney, Agent, or Firm—John W. LaBatt; Hoffman, Warnick & D'Alessandro LLC (57) ABSTRACT

A heterostructure semiconductor device that includes a composite layer between an active layer and a gate. The composite layer includes a strain matching layer and a barrier layer. The strain matching layer reduces the strain between the barrier layer and the active layer. The device can incorporate various additional layers as well as gate and/or contact configurations to obtain desired device performance characteristics.

20 Claims, 7 Drawing Sheets

OTHER PUBLICATIONS

"AlGaN/GaN Metal–Oxide–Semiconductor Heterostructure Field–Effect Transistors on SiC Substrates," M. Asif Khan et al., Applied Physics Letters, vol. 77, No. 9, Aug. 28, 2000, pp. 1339–1341.

"Si3N4/AlGaN/GaN—Metal–Insulator–Semiconductor Heterostructure Field–Effect Transistors," X. Hu et al., Applied Physics Letters, vol. 79, No. 17, Oct. 22, 2001, pp. 2832–2834.

"Insulating Gate III–N Heterostructure Field–Effect Transistors for High–Power Microwave and Switching Applications," M. Asif Khan et al., IEEE Transactions On Microwave Theory and Techniques, vol. 51, No. 2, Feb. 2003, pp. 624–633.

"Low Frequency Noise in GaN Metal Semiconductor and Metal Oxide Semiconductor Field Effect Transistors," S. L. Rumyantsev et al., Journal of Applied Physics, vol. 90, No. 1, Jul. 1, 2001, pp. 310–314.

"Induced Strain Mechanism of Current Collapse in AlGaN/GaN Heterostructure Field–Effect Transistors," G. Simin et al., American Institute of Physics, Applied Physics Letters, vol. 79, No. 16, Oct. 15, 2001, pp. 2651–2653.

"Elastic Strain Relaxation and Piezoeffect in GaN–AlN, GaN–AlGaN and GaN–lnGaN Superlattices," A.D. Bykhovski et al., Journal of Applied Physics, vol. 81, No. 9, May 1, 1997, pp. 6332–6338.

"Two Dimensional Electron Gas Enhancement in AlGaN/GaN/InGaN/GaN Quantum Well Structures," A. D. Bykhovski et al., Proceedings of 1999 International Device Research Symposium (ISDRS–99), ISBN 1–880920–06–9, pp. 307–310 (1999).

"Novel AlN/GaN Insulated Gate Heterostructure Field Effect Transistor with Modulation Doping and One–Dimensional Simulation of Charge Control," Syunji Imanaga et al., Journal of Applied Physics, vol. 82, No. 11, Dec. 1, 1997, pp. 5843–5858.

"Enhanced Electron Mobility in AlGaN/InGaN/AlGaN Double–Heterostructures by Piezoelectric Effect," Narihiko Maeda et al., Japanese Journal of Applied Physics, vol. 38, Part 2, No. 7B, Jul. 15, 1999, pp. L799–L801.

"AlGaN/InGaN/GaN Double Heterostructure Field–Effect Transistor," Grigory Simin et al., The Japan Society of Applied Physics, Japanese Journal of Applied Physics, vol. 40, Part 2, No. 11A, Nov. 1, 2001, pp. L1142–L1144.

"Low Frequency Noise in AlGaN/InGaN/GaN Double Heterostructure Field Effect Transistors," N. Pala et al., Solid–State Electronics 47 (2003), pp. 1099–1104.

"Low–Frequency Noise in GaN–Based Field Effect Transistors," M. E. Levinshtein et al., Noise and Fluctuations in Control in Electronic Devices, Chapter 4, 2002, pp. 49–65.

"Energy Band/Lattice Mismatch Engineering in Quaternary AlInGaN/GaN Heterostructure," M. Asif Khan et al., Phys. Stat, Sol. (a) 176, 227 (1999), pp. 227–230.

"Pulsed Atomic Layer Epitaxy of Quaternary AlInGaN Layers," J. Zhang et al., Applied Physics Letters, vol. 79, No. 7, Aug. 13, 2001, pp. 925–927.

"Piezoelectric Doping and Elastic Strain Relaxation in AlGaN–GaN Heterostructure Field Effect Transistors," A. D. Bykhovski et al., Applied Physics Letters, vol. 73, No. 24, Dec. 14, 1998, pp. 3577–3579.

"Piezoelectric Doping in AlInGaN/GaN Heterostructures," M. Asif Khan et al., Applied Physics Letters, vol. 75, No. 18, Nov. 1, 1999, pp. 2806–2808.

"III–Nitride, SiC and Diamond Materials for Electronic Devices," D. Kurt Gaskill et al., Materials Research Society Symposium Proceedings vol. 423, 1996, pp. 75–79.

"Pyroelectric and Piezoelectric Properties of GaN–Based Materials," M. S. Shur et al., MRS Internet J. Nitride Semicond. Res. 4S1, G1.6 (1999) pp. 1–12.

"Electron Transport in Wurtzite Indium Nitride," O'Leary et al., Journal of Applied Physics, vol. 83, No. 2, Jan. 15, 1998, pp. 826–829.

"Piezoeffect and Gate Current in AlGaN/GaN High Electron Mobility Transistors," R. Gaska et al., Applied Physics Letters, vol. 71, No. 25, Dec. 22, 1997, pp. 3673–3675.

"Two–Dimensional Electron–Gas Density in $Al_xGa_{1-x}N$/GaN Heterostructure Field–Effect Transistors," N. Maeda et al., Applied Physics Letters, vol. 73, No. 13, Sep. 28, 1998, pp. 1856–1858.

"Piezoelectric Charge Densities in AlGaN/GaN HFETs," P.M. Asbeck et al., Electronics Letters, vol. 33, No. 14, Jul. 3, 1997, pp. 1230–1231.

"Spontaneous Polarization and Piezoelectric Constants of III–V Nitrides," Bernardini et al., Physical Review B, vol. 56, No. 16, Oct. 15, 1997–II, pp. R10024–R10027.

"GaAs Devices and Circuits," M. S. Shur, Microdevices Physics and Fabrication Technologies, Plenum Publishing Corporation, New York (1987) p. 410.

"The Influence of the Strain–Induced Electric Field on the Charge Distribution in GaN–AlN–GaN Structure," Bykhovski et al., Journal of Applied Physics, vol. 74, No. 11, Dec. 1, 1993, pp. 6734–6739.

"Pyroelectricity in Gallium Nitride Thin Films," Bykhovski et al., Applied Physics Letters, vol. 69, No. 21, Nov. 18, 1996, pp. 3254–3256.

"Lattice and Energy Band Engineering in AlInGaN/GaN Heterostructures," M. Asif Khan et al., Applied Physics Letters, vol. 76, No. 9, Feb. 28, 2000, pp. 1161–1163.

"Electron Mobility in Modulation–Doped AlGaN–GaN Heterostructures," R. Gaska et al., Applied Physics Letters, vol. 74, No. 2, Jan. 11, 1999, pp. 287–289.

* cited by examiner

HETEROSTRUCTURE SEMICONDUCTOR DEVICE

REFERENCE TO PRIOR APPLICATIONS

This application is related in some aspects to a commonly owned co-pending U.S. patent application Ser. No. 09/966,563, filed on Sep. 27, 2001, and claims the benefit of co-pending U.S. Provisional Application No. 60/461,092, filed on Apr. 8, 2003, both of which are hereby incorporated herein by reference.

BACKGROUND OF THE INVENTION

1. Technical Field

The invention relates generally to field effect transistors, and more specifically to a nitride-based heterostructure field effect transistor having a quaternary strain matching layer for controlling strain.

2. Related Art

To date, III-N field effect transistors (i.e., a field effect transistor made of elements from group III and nitrogen) such as high microwave power heterojunction field effect transistors (HFETs), metal-oxide HFETs (MOSHFETs), and metal-insulator HFETs (MISHFETs) use AlGaN/GaN heterojunctions with the two-dimensional electron gas channel formed at the AlGaN/GaN heterojunction interface. This AlGaN/GaN heterojunction design has several limitations.

For example, in the heterojunction interface, carrier confinement is achieved by a self-consistent triangular potential quantum well. However, carriers can readily spill over into the buffer layer or the barrier layer. Such spill over increases low frequency noise and decreases transconductance. Further, carriers that have spilled over get trapped, thereby causing slow transient processes and a Radio Frequency (RF)-current collapse. Still further, a large gate voltage swing can lead to a significant strain modulation in both the buffer layer and barrier layer. The strain modulation can further contribute to current collapse.

To address these problems, some have suggested an AlGaN/GaN(or InGaN)/AlGaN double heterostructure design. While these devices show improvement in the low temperature (i.e., about 200 Kelvin) mobility, no improvement has been demonstrated for the room temperature mobility. Building on this, others have proposed a double heterostructure AlGaN/InGaN/GaN field effect transistor (DHFET) fabricated on an insulating SiC substrate. The DHFETs have demonstrated output RF powers as high as 4.3 Watts/millimeter (W/mm) in continuous wave (CW) mode, 6.3 W/mm in a pulsed mode, with a gain compression as low as four decibels. However, these devices have a relatively high level of low frequency noise that may indicate that these devices will have problems in yield and reliability. These problems are due to a large lattice mismatch between GaN, AlN, and InN, resulting in strong piezoelectric effects that significantly impact electrical and optical properties of III-N heterojunction devices.

As a result, a need exists for a field effect transistor having an increased lifetime and reliability, while exhibiting a reduced level of noise.

SUMMARY OF THE INVENTION

The invention provides a heterostructure semiconductor device that includes a composite layer between an active layer and a gate. The composite layer includes a strain matching layer and a barrier layer. The strain matching layer reduces an amount of strain between the barrier layer and the active layer. The composite layer can include additional layers, such as a quantum well layer, and the device can incorporate one or more additional strain matching layers to reduce strain between other layers. Various gate and/or contact configurations are also provided to further improve various aspects of the device performance.

A first aspect of the invention provides a heterostructure semiconductor device comprising: a substrate; a buffer layer on the substrate; an active layer on the buffer layer, the active layer comprising at least one group III element and N; and a composite layer on the active layer, the composite layer comprising: a strain matching layer over the active layer, the strain matching layer comprising three group III elements and N; and a barrier layer on the strain matching layer, the barrier layer comprising at least one group III element and N.

A second aspect of the invention provides a field effect transistor comprising: a substrate; a buffer layer on the substrate, the buffer layer comprising AlN; an active layer on the buffer layer, the active layer comprising GaN; and a composite layer over the active layer, the composite layer comprising: a strain matching layer over the active layer, the strain matching layer comprising AlInGaN; and a barrier layer on the strain matching layer, the barrier layer comprising AlGaN.

A third aspect of the invention provides a field effect transistor comprising: a substrate; a buffer layer on the substrate, the buffer layer comprising AlN; an active layer on the buffer layer, the active layer comprising GaN; and a composite layer, the composite layer comprising: a quantum well layer over the active layer, wherein the quantum well layer comprises InGaN; a strain matching layer on the quantum well layer, the strain matching layer comprising AlInGaN; and a barrier layer on the strain matching layer, the barrier layer comprising AlGaN.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

It is understood, that for purposes of this description Al means Aluminum, Ga means Gallium, N means Nitrogen, In means Indium, Si means Silicon, O means Oxygen, and C means Carbon. Further, it is understood that "group III elements" comprise the elements Al, Ga, In, Boron (B), and Thallium (Tl).

The invention provides a heterostructure semiconductor device that includes a composite layer between an active layer and a gate. The composite layer includes a strain matching layer and a barrier layer. The strain matching layer reduces an amount of strain between the barrier layer and the active layer. The composite layer can include additional layers, such as a quantum well layer, and the device can incorporate one or more additional strain matching layers to reduce strain between other layers. Various gate and/or contact configurations are also provided to further improve various aspects of the device performance.

Figure 1:
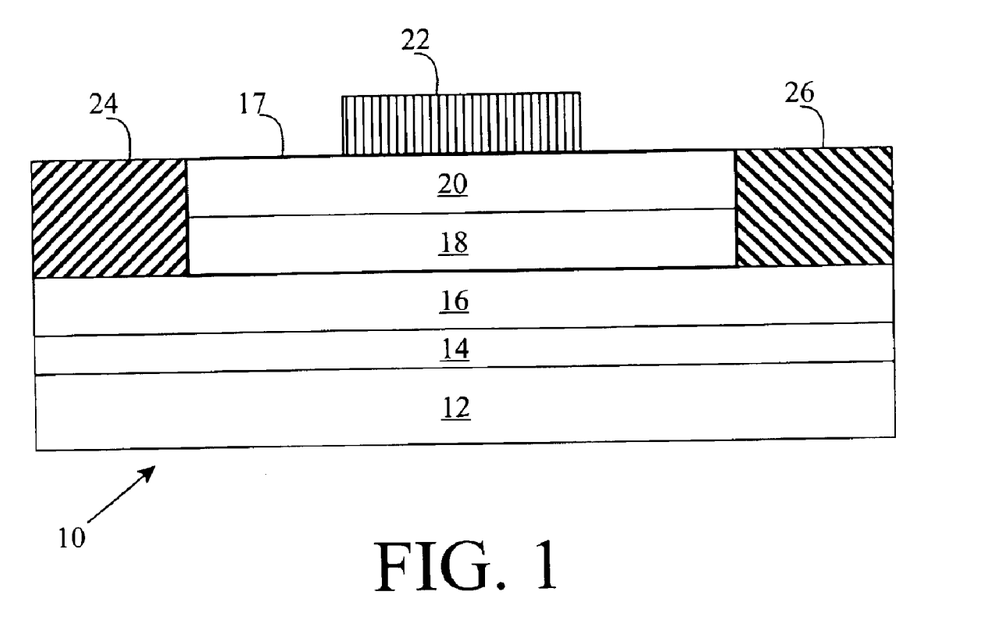
FIG. 1 shows a heterostructure semiconductor device according to one embodiment of the invention.

Turning to the Figures, FIG. 1 shows a heterostructure semiconductor device 10 according to one embodiment of the invention. Device 10 includes a plurality of stacked layers comprising a substrate 12, a buffer layer 14, an active layer 16, and a composite layer 17. Composite layer 17 includes a strain matching layer 18 and a barrier layer 20. It is understood that any of the layers described herein can comprise a short period superlattice, the various layers can comprise epitaxial structures formed using epitaxy, and device 10 can include n-type or p-type channels, as are known in the art. In one embodiment, active layer 16 comprises a quantum well, and buffer layer 14 has a wider band gap than active layer 16. Device 10 is configured to operate as a field effect transistor. As a result, device 10 includes a gate 22 stacked on composite layer 17, and a source contact 24 and a drain contact 26 each stacked on active layer 16. Both strain matching layer 18 and barrier layer 20 contact the sides of source contact 24 and drain contact 26.

It is understood that while shown having a source contact 24, gate 22, and drain contact 26 configuration, devices having various contact/gate configurations are possible under the invention. For example, gate 22 could comprise multiple gate fingers connected using bridges that comprise, for example, $SiO_2$. Further, the geometry of the contacts/gates could be such that a round source contact 24 is surrounded by a ring gate 22 and a ring drain 26 that form concentric circles about source contact 24. While the invention is shown and described as a field effect transistor throughout this discussion, it is understood that the invention can be applied to various types of semiconductor devices, including a photodetector, a gated bipolar junction transistor, a gated hot electron transistor, a gated heterostructure bipolar junction transistor, a gas sensor, a liquid sensor, a pressure sensor, a multi-function sensor (e.g., pressure and temperature), a power switching transistor, and a microwave transistor.

Device 10 can include any type of substrate 12. For example, substrate 12 can comprise sapphire, silicon carbide (SiC), spinel, silicon, bulk GaN, bulk AlN, or bulk AlGaN. Similarly, any type of buffer layer 14 can be used, for example, buffer layer 14 can comprise AlN. Active layer 16 can comprise a binary compound that includes N and an element selected from the group III elements, or a ternary compound that includes N and two elements selected from the group III elements. Strain matching layer 18 can comprise a quaternary layer that includes three group III elements and N. Barrier layer 20 can comprise a binary compound or ternary compound that includes one or two group III elements and N.

Figure 2:
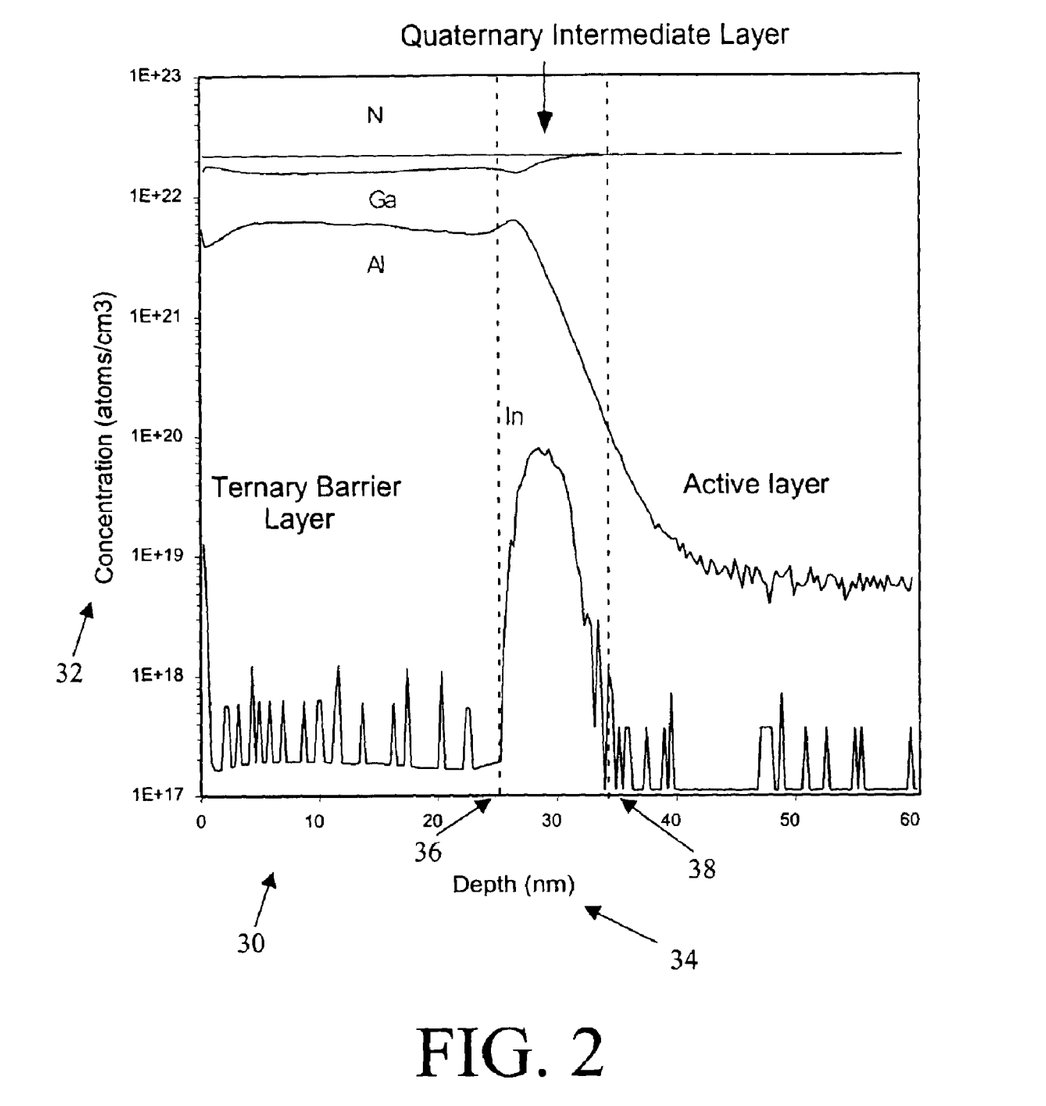
FIG. 2 shows a chart of the results of a Secondary Ion Mass Spectrometry analysis of the device in FIG. 1.

In one embodiment, device 10 comprises a substrate comprising SiC, a buffer layer 14 comprising AlN, an active layer 16 comprising GaN or InGaN, a strain matching layer 18 comprising AlInGaN, and a barrier layer 20 comprising AlGaN. FIG. 2 shows a chart 30 of the results of a Secondary Ion Mass Spectrometry (SIMS) analysis of device 10 having such a configuration. Chart 30 plots concentration 32 (atoms/$cm^3$) as a function of depth 34 (nanometers (nm)) within device 10. Barrier layer 20 is located at the top of device 10 and is shown to have relatively high, constant concentrations of Al, Ga, and N. At a depth of approximately twenty-five nm 36, strain matching layer 18 begins. Strain matching layer 18 has a substantially higher concentration of In than barrier layer 20 while maintaining relatively high concentrations of Al, Ga, and N. Strain matching layer 18 has a thickness of about 10 nm, so active layer 16 begins at a depth of approximately thirty-five nm 38. Active layer 16 has substantially lower concentrations of both Al and In than strain matching layer 18, while maintaining constant concentrations of Ga and N.

It is understood that concentrations of the various elements in any layer can remain constant, vary gradually, or vary abruptly both within a layer or at a junction between two layers. A desired molar ratio can be used to determine a desired quantity of each group III element in a particular layer. For example, when a ternary compound such as AlGaN is to be used, the ternary compound can be expressed as $Al_xGa_{1-x}N$. In other words, the molar ratio of the two group III elements is such that for every x moles of Al, there are 1-x moles of Ga, where 0<x<1. Similarly, when a quaternary compound such as AlGaInN is to be used, the quaternary compound can be expressed as $Al_xGa_yIn_{1-x-y}N$. That is, for every mole of group III elements, x moles are Al, y moles are Ga, and 1-x-y moles are In, wherein 0<x<1, 0<y<1, and x+y<1.

Figure 3:
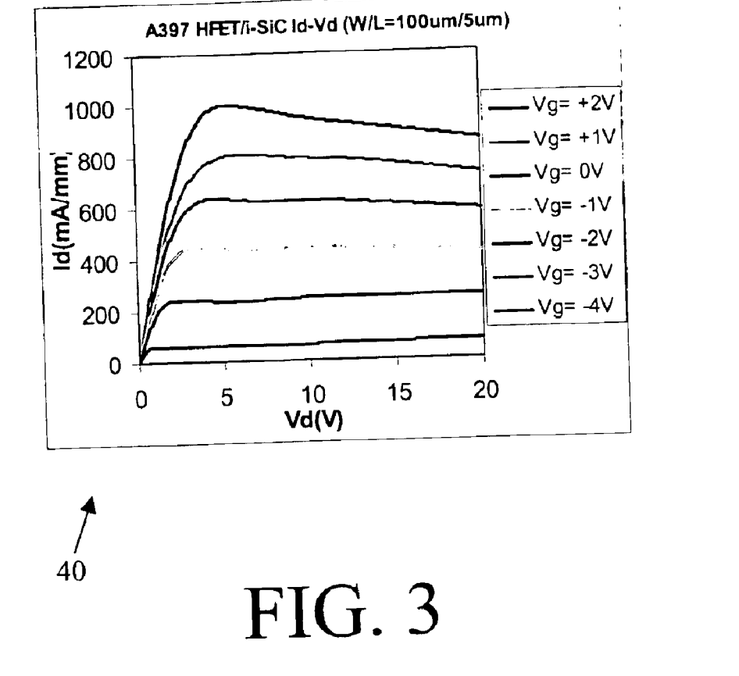
FIG. 3 shows a chart of current as a function of voltage for the device in FIG. 1.
Figure 4:
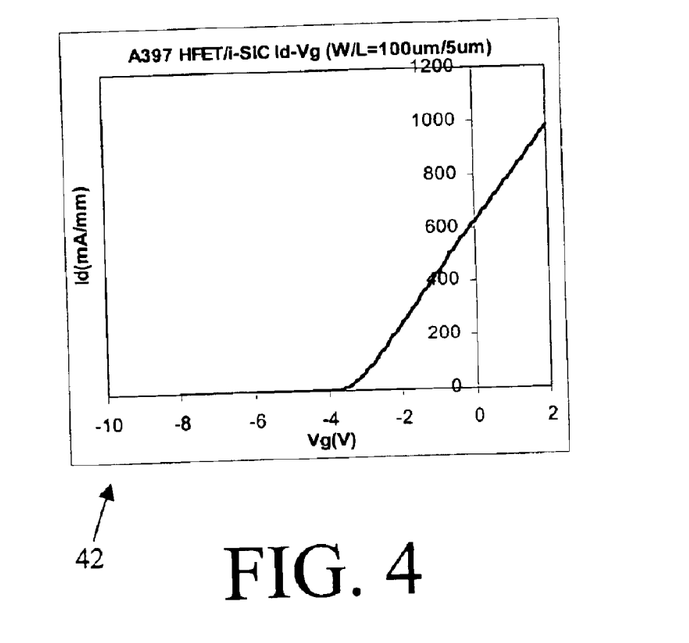
FIG. 4 shows a chart of the transfer characteristics for the device in FIG. 1 in the saturation regime.
Figure 5:
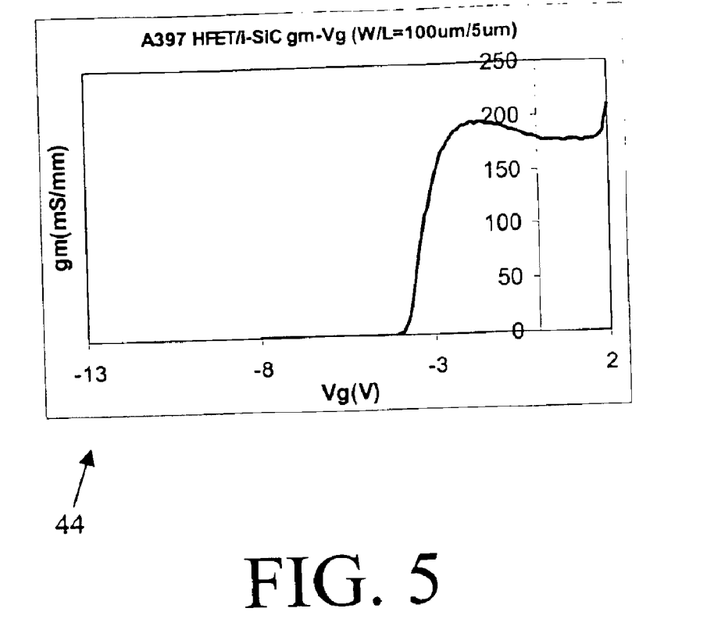
FIG. 5 shows a chart of the transconductance of the device in FIG. 1 in the saturation regime.
Figure 6:
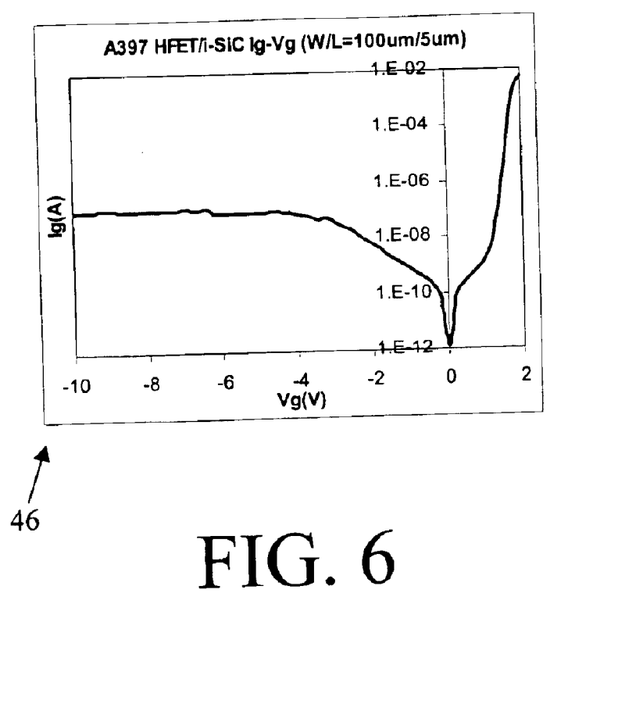
FIG. 6 shows a chart of the gate current of the device in FIG. 1.

Returning to FIG. 1, to test device 10, a gate 22 having a length of about 1.5 microns was placed on composite layer 17 (i.e., barrier layer 20), and a source contact 24 and a drain contact 26 were placed on active layer 16 about five microns apart. FIG. 3 shows a chart 40 of device current as a function of device voltage for various grid voltages applied to device 10, FIG. 4 shows a chart 42 of the transfer characteristics (i.e., device current as a function of voltage) for device 10 in the saturation current regime, FIG. 5 shows a chart 44 of the transconductance (i.e., device output current as a function of input voltage) of device 10 in the saturation current regime, and FIG. 6 shows a chart 46 of the gate current of device 10. As can be seen from FIGS. 3–6, device 10 exhibited superior performance than prior art devices having a similar gate length. In particular, device 10 has an excellent linearity (e.g., a very small variation of the device transconductance in the gate voltage range from −2 V to 2 V), a small knee voltage, and a small gate leakage current.

Figure 7:
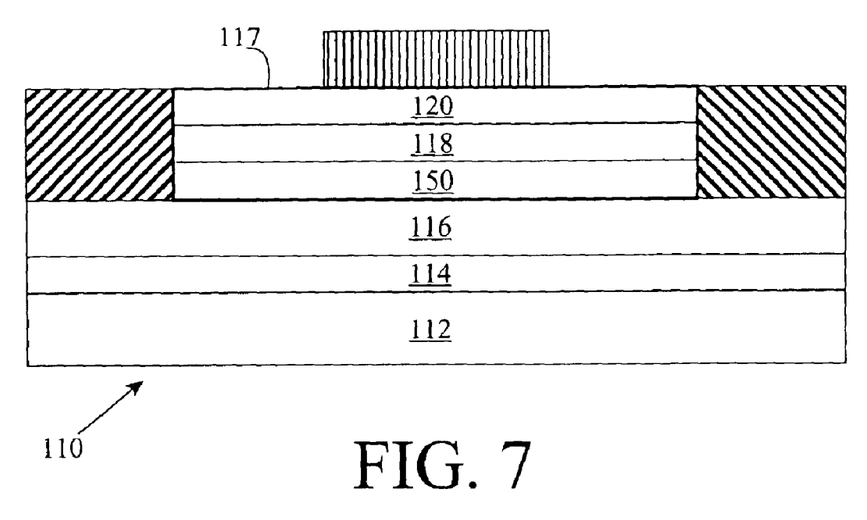
FIG. 7 shows a heterostructure semiconductor device according to a second embodiment of the invention.

Several variations can be made to device 10. For example, FIG. 7 shows a device 110 that includes a plurality of stacked layers comprising a substrate 112, a buffer layer 114, an active layer 116, and a composite layer 117. In this embodiment, composite layer 117 includes a barrier layer 120, a strain matching layer 118, and a quantum well layer 150. Quantum well layer 150 can comprise a ternary compound that includes two group III elements and N. The inclusion of quantum well layer 150 provides an improved carrier localization. In one embodiment of device 110, buffer layer 114 comprises AlN, active layer 116 comprises GaN or InGaN, quantum well layer 150 comprises InGaN, strain matching layer 118 comprises AlInGaN, and barrier layer 120 comprises AlGaN.

Figure 8:
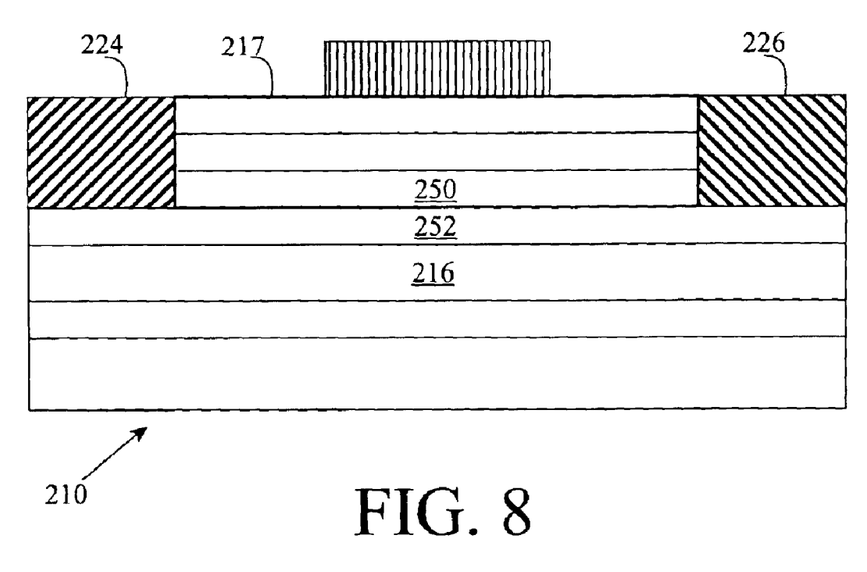
FIG. 8 shows a heterostructure semiconductor device according to a third embodiment of the invention.

FIG. 8 shows another device 210 according to still another embodiment of the invention. Device 210 includes a second strain matching layer 252 on an active layer 216 and below a composite layer 217. The presence of second strain matching layer 252 provides additional control over polarization charges in device 210. Second strain matching layer 252 contacts the bottom layer of composite layer 217, i.e., quantum well layer 250. Second strain matching layer 252 can comprise a quaternary layer that includes three group III elements and N, for example, AlGaInN. In this embodiment, a source contact 224 and a drain contact 226 are shown placed on second strain matching layer 252 instead of directly contacting active layer 216.

Figure 9:
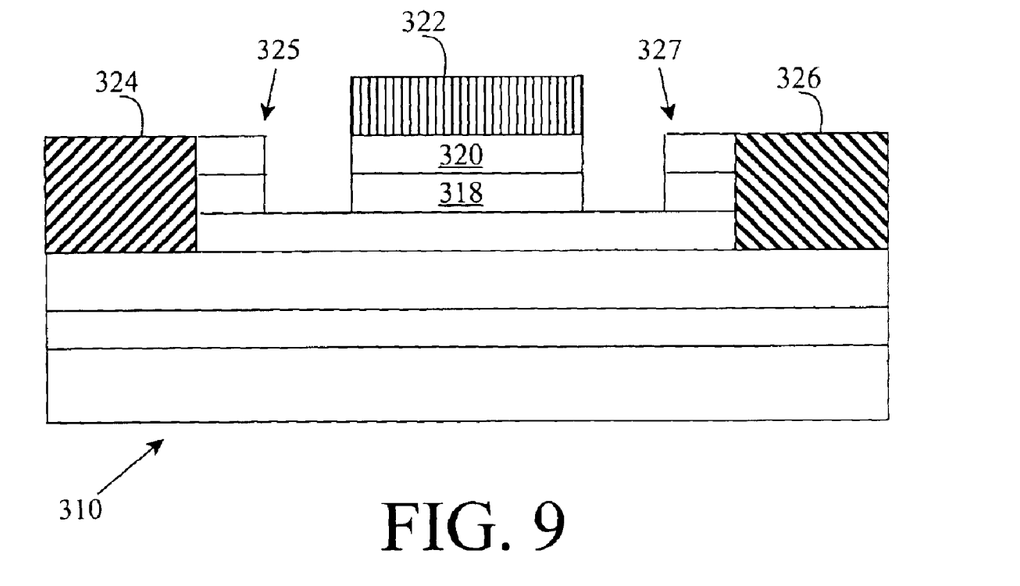
FIG. 9 shows a heterostructure semiconductor device according to a fourth embodiment of the invention.

FIG. 9 shows another device 310 according to still another embodiment of the invention. Device 310 is configured to operate as a field effect transistor having a recessed gate 322 structure/stack. The recessed gate 322 configuration allows for improved control of strain and electric field distribution near the edges of gate 322. As a result, strain and trapping effects near the edges of gate 322 are reduced. The recessed gate 322 structure can be formed, for example, by removing portions of barrier layer 320 and strain matching layer 318 that are located between gate 322 and a source contact 324, and between gate 322 and a drain contact 326. Alternatively, a mask can be used to prevent barrier layer 320 and/or strain matching layer 318 from being deposited on certain areas of device 310. As shown, barrier layer 320 and strain matching layer 318 can include portions 325, 327 that contact source contact 324 and/or drain contact 326, respectively. However, the portions of barrier layer 320 and strain matching layer 318 below gate 322 do not contact these portions 325, 327.

Figure 10:
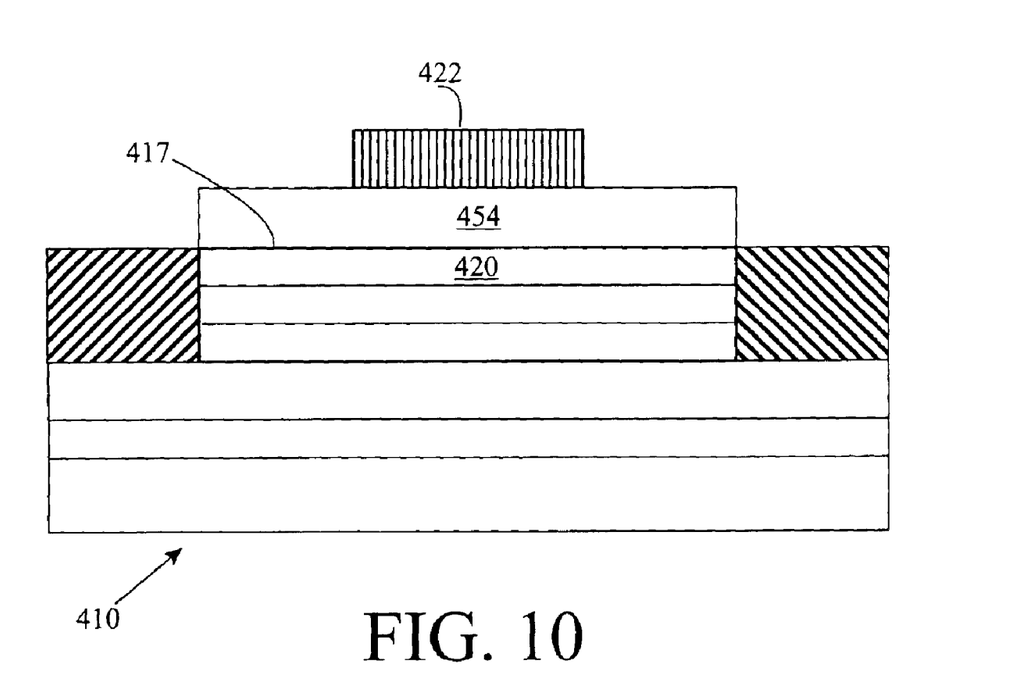
FIG. 10 shows a heterostructure semiconductor device according to a fifth embodiment of the invention.

FIG. 10 shows another device 410 that includes a dielectric layer 454 stacked on composite layer 417 (i.e., barrier layer 420), and has a gate 422 placed on dielectric layer 454. By incorporating dielectric layer 454, the amount of leakage current that passes through gate 422 is substantially reduced. Dielectric layer 454 can include Si, and can comprise one or more layers of, for example, $SiO_2$, and/or SiN. Further, dielectric layer 454 can comprise a ferroelectric layer.

Figure 11:
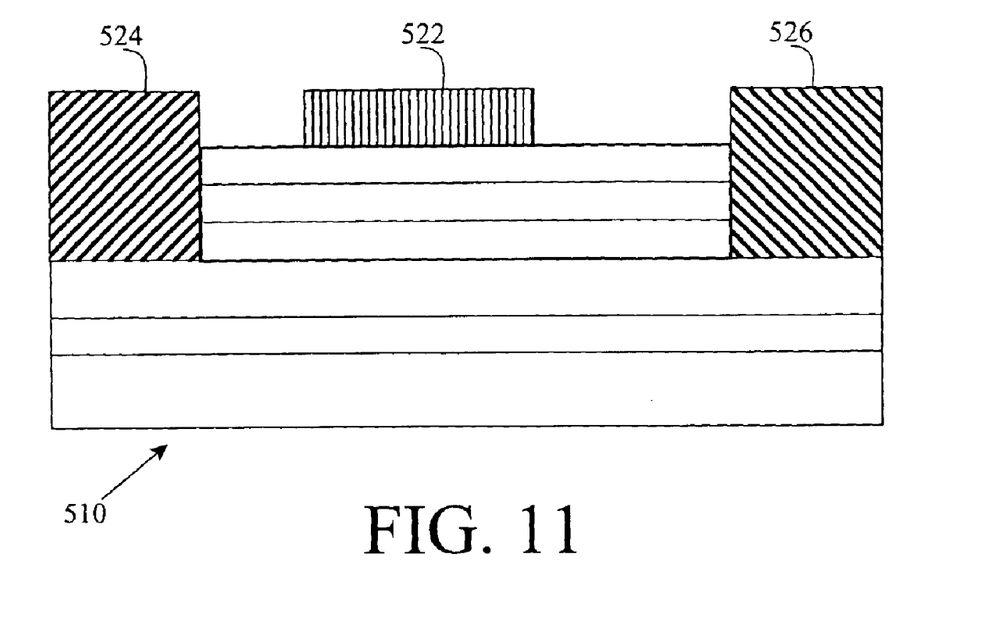
FIG. 11 shows a heterostructure semiconductor device according to a sixth embodiment of the invention.

FIG. 11 shows another device 510 configured to operate as a field effect transistor in which a gate 522 is positioned such that the distance from gate 522 to a source contact 524 is less than the distance from gate 522 to a drain contact 526. By configuring device 510 in this manner, the breakdown voltage for device 510 is increased. Various other gate 522/source contact 524 configurations are possible. For example, the distance from gate 522 to source contact 524 can be zero, and gate 522 can at least partially overlap source contact 524.

Figure 12:
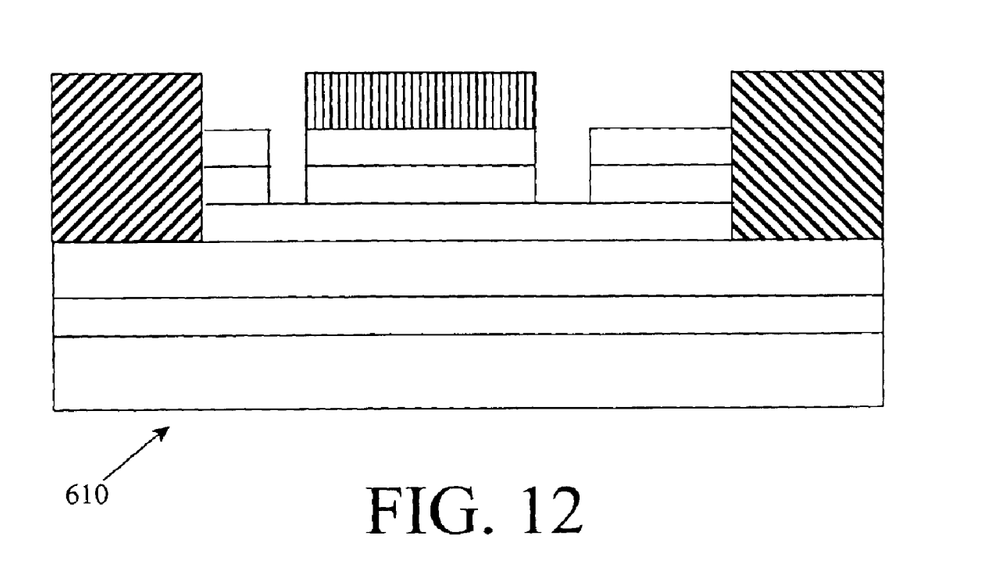
FIG. 12 shows a heterostructure semiconductor device according to a seventh embodiment of the invention.

Finally, FIG. 12 shows another device 610 in which the offset gate shown in FIG. 11, and the recessed gate shown in FIG. 9 are combined. By configuring device 610 in this manner, both a larger breakdown voltage and increased reliability are obtained. While the various alternatives are shown incorporating certain alterations and combinations of alterations, it is understood that any combination of the various alterations discussed and other alterations can be incorporated in devices under this invention.

The foregoing description of various embodiments of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A heterostructure semiconductor device comprising:
   a substrate;
   a buffer layer on the substrate;
   an active layer on the buffer layer, the active layer comprising at least one group III element and N;
   a composite layer on the active layer, the composite layer comprising:
      a strain matching layer over the active layer, the strain matching layer comprising three group III elements and N; and
      a barrier layer on the strain matching layer, the barrier layer comprising at least one group III element and N; and
   at least one contact over the active layer and adjacent to the composite layer.

2. The device of claim 1, further comprising a gate on the barrier layer.

3. The device of claim 1, wherein the at least one contact comprises:
   a source contact on the active layer; and
   a drain contact on the active layer.

4. The device of claim 3, wherein the strain matching layer and the barrier layer contact both the source contact and the drain contact.

5. The device of claim 1, further comprising:
   a dielectric layer on the barrier layer, wherein the dielectric layer includes Si; and
   a gate on the dielectric layer.

6. The device of claim 1, wherein the substrate comprises one of the group consisting of: sapphire, SiC, spinel, Si, bulk GaN, bulk AlN, or bulk AlGaN.

7. The device of claim 1, wherein the device comprises one of the group consisting of:
   a photodetector, a field effect transistor, a gated bipolar junction transistor, a gated hot electron transistor, a gated heterostructure bipolar junction transistor, a gas sensor, a liquid sensor, a pressure sensor, a multi-function sensor, a power switching transistor, and a microwave transistor.

8. A field effect transistor comprising:
   a substrate;
   a buffer layer on the substrate, the buffer layer comprising AlN;
   an active layer on the buffer layer, the active layer comprising GaN;
   a composite layer over the active layer, the composite layer comprising:
      a strain matching layer over the active layer, the strain matching layer comprising AlInGaN; and
      a barrier layer on the strain matching layer, the barrier layer comprising AlGaN; and at least one contact over the active layer and adjacent to the composite layer.

9. The transistor of claim 8, further comprising:

a dielectric layer on the barrier layer; and a gate on the dielectric layer.

10. The transistor of claim 9, wherein the dielectric layer comprises at least one of the group consisting of: $SiO_2$ and SiN.

11. The transistor of claim 8, wherein the at least one contact comprises:

a source contact on the active layer;

a drain contact on the active layer; and further comprising a gate on the barrier layer, wherein a distance from the gate to the drain contact is greater than a distance from the gate to the source contact.

12. The transistor of claim 11, wherein the portions of the strain matching layer and the gate barrier layer directly below the gate do not contact at least one of the source contact and the drain contact.

13. The transistor of claim 8, wherein the composite layer further comprises a quantum well layer directly below and in contact with the strain matching layer, wherein the quantum well layer comprises InGaN.

14. The transistor of claim 13, further comprising a second strain matching layer on the active layer and directly below and in contact with the quantum well layer, wherein the second strain matching layer comprises AlInGaN.

15. The transistor of claim 14, further comprising:

a gate on the barrier layer; and wherein the at least one contact comprises:

a source contact on the second strain matching layer; and a drain contact on the second strain matching layer.

16. The transistor of claim 13, wherein the at least one contact comprises:

a source contact on the active layer; and a drain contact on the active layer, wherein the quantum well layer contacts both the source contact and the drain contact.

17. The transistor of claim 16, wherein the portions of the strain matching layer and the gate barrier layer directly below a gate do not contact at least one of the source contact and the drain contact.

18. A field effect transistor comprising:

a substrate;

a buffer layer on the substrate, the buffer layer comprising AlN;

an active layer on the buffer layer, the active layer comprising GaN; and a composite layer, the composite layer comprising:

a quantum well layer over the active layer, wherein the quantum well layer comprises InGaN;

a strain matching layer on the quantum well layer, the strain matching layer comprising AlInGaN; and a barrier layer on the strain matching layer, the barrier layer comprising AlGaN.

19. The transistor of claim 18, further comprising a second strain matching layer on the active layer and directly below and in contact with the quantum well layer, wherein the second strain matching layer comprises AlInGaN.

20. The transistor of claim 18, further comprising a dielectric layer on the barrier layer, wherein the dielectric layer comprises at least one of the group consisting of: $SiO_2$ and SiN.

* * * * *